(12) United States Patent
Adachi et al.

(10) Patent No.: US 8,016,940 B2
(45) Date of Patent: Sep. 13, 2011

(54) PROCESSING METHOD FOR ORGANIC CRYSTAL, PROCESSING DEVICE FOR ORGANIC CRYSTAL, AND OBSERVING DEVICE FOR ORGANIC CRYSTAL

(75) Inventors: Hiroaki Adachi, Minoo (JP); Hiroshi Kitano, Moriguchi (JP)

(73) Assignees: Nikon Corporation, Tokyo (JP); Hiroaki Adachi, Minoo-shi (JP); Takatomo Sasaki, Suita-shi (JP); Yusuke Mori, Katano-shi (JP); Kazufumi Takano, Suita-shi (JP); Tsuyoshi Inoue, Toyanaka-shi (JP); Hiroyoshi Matsumura, Ibaraki-shi (JP)

( * ) Notice: Subject to any disclaimer, the term of this patent is extended or adjusted under 35 U.S.C. 154(b) by 619 days.

(21) Appl. No.: 10/594,375

(22) PCT Filed: Mar. 30, 2005

(86) PCT No.: PCT/JP2005/006695
§ 371 (c)(1),
(2), (4) Date: Jul. 2, 2007

(87) PCT Pub. No.: WO2005/095042
PCT Pub. Date: Oct. 13, 2005

(65) Prior Publication Data
US 2007/0278719 A1 Dec. 6, 2007

(30) Foreign Application Priority Data
Mar. 31, 2004 (JP) .................................. 2004-105375
May 27, 2004 (JP) .................................. 2004-158133

(51) Int. Cl.
*C30B 1/02* (2006.01)
(52) U.S. Cl. ............. 117/8; 117/2; 117/3; 117/4; 117/9; 117/927

(58) Field of Classification Search ................ 117/2, 3, 117/4, 8, 9, 927
See application file for complete search history.

(56) References Cited

U.S. PATENT DOCUMENTS
6,183,348 B1 2/2001 Bingham et al.
(Continued)

FOREIGN PATENT DOCUMENTS
JP 57-118882 7/1982
(Continued)

OTHER PUBLICATIONS
"Protein Processing With Ultraviolet Laser; Osaka Univ. and Nikon: No Damage to Crystal," Business & Technology, Jan. 27, 2004.
(Continued)

*Primary Examiner* — Robert M Kunemund
(74) *Attorney, Agent, or Firm* — Holtz, Holtz, Goodman & Chick, PC

(57) ABSTRACT

The short-pulse laser light 9 emitted from the short-pulse laser light source 1 is focused on and caused to irradiate an organic crystal 8 contained in a sample container 6 via a shutter 2, intensity adjusting element 3, irradiation position control mechanism 4, and focusing optical system 5. The sample container 6 is carried on a stage 7, and can be moved in three dimensions along the x axis, y axis and z axis in an x-y-z orthogonal coordinate system with the direction of the optical axis being taken as the z axis; furthermore, the sample container 6 can be rotated about the z axis. Working of the organic crystal 8 is performed by means of short-pulse laser light that is focused on and caused to irradiate the surface of the organic crystal 8. Prior to working, nitrogen is caused to jet onto the sample container 6 by a low-temperature gas jet device C that is a cooling device; consequently, the organic crystal 8 is cooled to −150° C. or below. As a result, it is possible to work the object of working in a fixed state, and to increase the working efficiency by means of the short-pulse laser light that is used.

18 Claims, 10 Drawing Sheets

U.S. PATENT DOCUMENTS 6,191,384 B1   2/2001   Hennessey

FOREIGN PATENT DOCUMENTS

| JP | 57-118882 A | 7/1982 |
| JP | 63-5892 | 1/1988 |
| JP | 63-5892 A | 1/1988 |
| JP | 8-43325 | 2/1996 |
| JP | 8-43325 A | 2/1996 |
| JP | 2003-71828 | 3/2003 |
| JP | 2003-71828 A | 3/2003 |
| WO | WO 2004/086121 A1 | 10/2004 |
| WO | WO 2005/026238 A1 | 3/2005 |
| WO | WO 2005/02238 A1 | 5/2005 |

OTHER PUBLICATIONS

"Protein Crystal Processing, X-Ray Diffraction Pattern Improved; Osaka Univ. and Nikon: Use of UV Laser," Business & Technology, Feb. 13, 2004.

Hiroaki Adachi, Masashi Yoshimura, Yusuke Mori and Takatomo Sasaki (Department of Electrical Engineering, Osaka University), "New Laser Application on Organic and Protein Research," Digest of Technical Papers, 24th Annual Meeting of the Laser Society of Japan, Jan. 29-30, 2004.

A. Murakami, H. Kitano, H. Adachi, H. Muramatsu, K. Takano, Y. Mori, S. Owa, T. Sasaki (Osaka Univ. Crystal Design Project, Osaka Univ. Post Graduate Institute, Nikon Corporation), "Protein Crystal Processing Using Ultraviolet Laser," Digest of Technical Papers, Annual Meeting of the Crystal Society of Japan, Dec. 1-2, 2003.

Communication (Supplementary European Search Report) mailed Mar. 12, 2009 issued from the European Patent Office in related European Application Serial No. EP 05 72 8657.7 (4 pages).

Joseph C. Chon and Paul B. Comita, "Laser Ablation of Nonliner-Optical Polymers to Define Low-Loss Optical Channel Waveguides," Optical Society of America, Optics Letters, vol. 19, No. 22, Nov. 15, 1994, New York, N.Y., pp. 1840-1842.

Ph. Dittrich, R. Bartlome, G. Montemezzani and P. Günter, "Femtosecond Laser Ablation of DAST," Applied Surface Science 220, May 21, 2003, pp. 88-95.

Fumi Tsunesada, Hiroaki Adachi, Yoichiro Hosokawa, Hiroshi Masuhara, Masashi Yoshimura, Yusuke Mori and Takatomo Sasaki, "Shuko Femto-Byo Laser Beam o Mochiita Kesshokaku Seisei no Seigyo (1), " Dai 50 Kai Oyo Butsurigaku Kankei Rengo Koenkai Koen Yokoshu, No. 3, Mar. 27, 2003.

Hiroshi Kitano, Hiroaki Adachi, Atsutoshi Murakami, Hiroyoshi Matsumura, Kazufumi Takano, Tsuyoshi Inoue, Yusuke Mori, Soichi Owa and Takatomo Sasaki, "Protein Crystal Processing Using a Deep-UV Laser," Japanese Journal of Applied Physics, vol. 43, No. 1A/B, 2004, pp. L73-L75, Dec. 26, 2003.

Hiroaki Adachi, Masashi Yoshimura, Yusuke Mori and Takatomo Sasaki, "Yuki Tanpakushitsu ni Okeru Atarashii Laser Oyo (Technique For Laser Processing of Protein Crystals)," Digest of Technical Papers, Annual Meeting of the Laser Society of Japan, Dai 24 Kai, Jan. 29, 2004.

Hiroshi Kitano, Hiroaki Adachi, Atsutoshi Murakami, Hiroyoshi Matsumura, Kazufumi Takano, Tsuyoshi Inoue, Yusuke Mori, Soichi Owa and Takatomo Sasaki, "New Approach to Improve X-Ray Diffraction Pattern of Protein Crystal Using UV-Laser Ablative Processing," Japanese Journal of Applied Physics, vol. 43, No. 2B, 2004, pp. L297-L299, Feb. 6, 2004.

Hiroaki Adachi, Yoichiro Hososkawa, Hiroshi Masuhara, Masashi Yoshimura, Yusuke Mori and Takatomo Sasaki, "Tan-Puls Laser o Mochiita Tanpakushitsu no Kesshoka," The Review of Laser Engineering, Feb. 15, 2004.

PCT International Search Report dated Jul. 12, 2005.

U.S. Appl. No. 11/372,382, filed Mar. 9, 2006.

(a)

(b)

(c)

PROCESSING METHOD FOR ORGANIC CRYSTAL, PROCESSING DEVICE FOR ORGANIC CRYSTAL, AND OBSERVING DEVICE FOR ORGANIC CRYSTAL

This application is a U.S. National Phase Application under 35 USC 371 of International Application PCT/JP2005/006695 filed Mar. 30, 2005.

TECHNICAL FIELD

The present invention relates to an organic crystal working method, and more particularly to a method and apparatus for working an organic crystal into a desired shape by irradiating the organic crystal with short-pulse laser light, and also relates to an organic crystal observation device that incorporates such an organic crystal working apparatus.

BACKGROUND ART

In recent years, research on organic materials having high functions and high performance that exceed the characteristics of inorganic materials has attracted attention, and organic devices of the next generation have been developed. In order to achieve this, the development of new organic materials is absolutely indispensable, and in fields such as applied chemistry, molecular steric structure is determined by structural analysis of newly synthesized materials, and the functions of these materials are inferred. Furthermore, post-genome research known as proteome has been actively pursued. Something that has attracted particular attention is research that is referred to as "structural genome science," which attempts to elucidate the three-dimensional structure of proteins. Elucidation of the structures and functions of proteins is directly connected to the treatment of diseases and the creation of drugs, and is therefore expected to have merits that lead to the elucidation of life phenomena. When the structures and functions of various organic materials are analyzed, there are often cases in which measurements are performed not at an ordinary temperature, but by cooling the object of analysis to a low temperature. X-ray crystal structure analysis, which is one of the important means for analyzing the detailed steric structures of organic materials, may be cited as a representative example of such analysis.

In order to apply X-ray crystal structure analysis, single crystals of organic materials that are the object of analysis are required. There are instances in which measurements are performed in a state in which crystals are cooled in order to prevent damage to the organic crystals caused by irradiation with high-intensity X-rays. In cases where extremely brittle crystals such as protein crystals are the object of analysis, in particular, crystal structure analysis is generally performed in a cooled state (at an extremely low temperature of −150° C. or lower) by means of a low-temperature gas such as nitrogen.

The measurement precision of the X-ray crystal structure analysis is affected by the quality of organic crystals that are the object of analysis, the presence or absence of adhering matter around the crystals, and the like. In order to perform measurement with high precision, single crystals of good quality that have a desired shape are necessary. However, since crystallization conditions and growth conditions for obtaining good-quality single crystals have not been established for most organic materials, crystal preparation is extremely difficult. Moreover, even if crystallization is successful, trouble occurs in terms of targeted measurement in that single crystals cannot be obtained, there are problems in crystal quality, etc. Furthermore, solution adhering to the periphery of the crystal, substance holding the crystal, and the like become factors which lower the measurement precision.

Accordingly, there are cases in which the following types of working are required: namely, organic crystals constituting the object of analysis are adjusted to a shape that is appropriate for X-ray crystal structure analysis, only portions with good crystal quality are extracted, adhering matter or the like that is unwanted for the measurement is removed from the crystal surfaces, etc.

However, since crystals of organic materials are softer and more brittle than crystals of inorganic materials, damage such as cracking and splitting occurs in peripheral parts if a large impact is applied during working. Of these crystals, biomolecular crystals such as protein crystals and macromolecular crystals that are handled in supramolecular chemistry belong to an especially soft category of organic crystals; accordingly, handling is extremely difficult. Currently used working methods for organic crystals are working methods that require mechanical contact with these crystals. However, these methods have major problems in terms of working precision or the like.

Furthermore, the mechanical working methods described above are premised on working at ordinary temperatures, and it has been extremely difficult to adapt such methods to working under low-temperature conditions in which the object of working is frozen. Accordingly, in cases where there was a need for working following the cooling of organic crystals to a low-temperature state, the only handling method available so far was to first return such organic crystals to an ordinary temperature and then to perform working. However, by subjecting organic crystals over and over to a large temperature change from a low temperature to an ordinary temperature or from an ordinary temperature to a low temperature for the purpose of performing working, organic crystals are damaged, or irreversible structural alteration occurs, so that there are cases in which desired measurement cannot be performed.

DISCLOSURE OF THE INVENTION

As a method for solving the problems in the mechanical working of polymer crystals, the present inventors invented a method for working polymer crystals by means of irradiation with ultraviolet short-pulse laser light (hereafter referred to as the "invention of the previous application"), and filed for patents as Japanese Patent Application No. 2003-320190 and Japanese Patent Application No. 2004-19516.

This method of the invention of the previous application focuses attention on the fact that since the wavelength of ultraviolet short-pulse laser light is short, the photon energy is high, so that working by directly cleaving the chemical bonds of polymer crystals is possible. This is fundamentally different in terms of working principle from working by utilizing a widely used carbon dioxide gas laser or YAG laser. Specifically, in working by using a carbon dioxide gas laser or YAG laser, cleaving is performed by utilizing fusion caused by the generation of heat in laser light irradiated parts, and there is a problem in that the cleaved surface is damaged by heat. In the invention of the previous application, on the other hand, since working involves directly cleaving the chemical bonds of polymer crystals, smooth working is achieved with high precision with far less effect of heat.

However, the invention of the previous application is premised on working at ordinary temperatures, so that when X-ray crystal structure analysis is performed under low-temperature conditions, if working is required following cooling, this presents a problem in that the object of working must be first returned to an ordinary temperature. Moreover, depending on the working method involved, the following problems are encountered. Firstly, in cases where the object of working is to be worked in a state in which this object is held in a liquid or liquid film, the object of working may move during working, so that the worked surface may not be as expected in some instances. Secondly, in cases where a liquid adheres to the periphery of the object of working, the laser light irradiation position on the object of working or the irradiation intensity may vary in some instances as a result of the adhering liquid moving or the liquid in another portion entering due to the irradiation with short-pulse laser light. Furthermore, in cases where laser light is absorbed by the adhering liquid, even if the liquid in the irradiated portion is removed by laser ablation, if the liquid in another portion enters this removed portion, the new liquid must be successively removed, so that there are cases in which the working efficiency by means of laser light is reduced.

The present invention was devised in light of such circumstances; it is an object of the present invention to improve the invention of the previous application and to provide an organic crystal working method and working apparatus which make it possible to work a cooled object of working in a fixed state without subjecting this object to a large temperature change, and to increase the working efficiency. Furthermore, it is another object of the present invention to provide an organic crystal observation device which incorporates this working apparatus, and which allows for quick observation of organic crystals.

The first invention that is used to achieve the object described above is an organic crystal working method in which an organic crystal is worked by irradiation with short-pulse laser light, wherein the portion of this organic crystal being worked is worked in a state in which this crystal is cooled to a low temperature.

In the present invention, in the working of the organic crystal, this working is performed in a state in which the portion of the organic crystal being worked is cooled to a low temperature. The "low temperature" referred to in the present specification and claims indicates a temperature range in which the object of working is frozen or a temperature range in which the substance holding the object of working is hardened to an extent that does not cause any deformation or positional fluctuation during working. Accordingly, the low-temperature cooled state can be determined as appropriate according to the type of the object of working involved and to the type of substance holding the object of working.

If this is done, even in cases where a liquid adheres to the surface of an organic crystal, especially even in cases where an organic crystal is worked while being held in a liquid, the movement of the liquid caused by irradiation with short-pulse laser light is suppressed by virtue of this liquid also being cooled and frozen, so that working can be performed with a high degree of precision. Furthermore, even in cases where the adhering liquid absorbs the irradiating laser light, there is less possibility of the liquid coming from another portion into the portion where the liquid is removed. Therefore, the absorption of the short-pulse laser light by the liquid is reduced, so that the working efficiency is increased.

Moreover, for example, in cases where some type of observation of an organic crystal is performed in a state in which this organic crystal is cooled to a low temperature, if working is performed while maintaining the temperature of the crystal in the vicinity of the temperature during observation, it becomes easier to repeat observation and working without subjecting this organic crystal to a temperature cycle between a low temperature and an ordinary temperature, which makes it possible to avoid damage to the organic crystal and an effect involving the alteration of the structure which accompanies a large temperature change.

In addition, in cases where the organic crystal consists of a material containing moisture, working in a low-temperature frozen state also makes it easier to avoid problems such as degeneration of the crystal caused by drying.

With regard to the laser light with which the object of working is irradiated, short-pulse laser light is desirable because heat accumulation effect on the object of working increases in working using continuous light. The short-pulse laser light refers to laser light having a pulse width and a pulse interval which are such that the object of working that is cooled to a low temperature does not undergo degeneration or fusion due to temperature elevation caused by the laser irradiation, and such that the substance holding the object of working is not deformed or does not generate any positional fluctuation due to temperature elevation caused by the laser irradiation.

Furthermore, the "organic crystal" referred to in the present specification and claims includes crystals of organic polymer materials such as resins, proteins, sugars, lipids and nucleic acids and of organic supramolecular complexes, in addition to organic low-molecular crystal.

The second invention that is used to achieve the object described above is an organic crystal working method in which an organic crystal is worked by irradiation with short-pulse laser light, wherein working is performed in a state in which the portions of this organic crystal and a substance holding this organic crystal that are being worked are cooled to a low temperature.

In this invention, working is performed in a state in which not only the portion of the organic crystal being worked but also the portion of the substance holding this organic crystal being worked are cooled to a low temperature. Accordingly, in addition to the operational effect of the first invention, this invention makes it possible to prevent the object of working from moving during working, so that working along the targeted worked surface becomes possible. This invention is particularly preferable when the object of working is held by a substance that is a liquid at ordinary temperatures.

The third invention that is used to achieve the object described above is the first invention or second invention, wherein the state in which the crystal is cooled to a low temperature is 0° C. or below.

The preferable cooling temperature for the portion being worked varies according to the type of organic crystal, the purpose of use, and the like, and therefore cannot be determined definitively. However, organic crystals for which the present invention is effective often contain moisture inside portions of the crystals being worked themselves or portions holding the crystals being worked; therefore, a preferable temperature range that can be used is 0° C. and below, at which water freezes.

The fourth invention that is used to achieve the object described above is any of the first through third inventions, wherein the method for cooling the portion of the organic crystal that is being worked or the portions of the organic crystal and the substance holding this organic crystal that are being worked to a low temperature is a method in which a low-temperature gas is caused to jet directly or indirectly onto an area that includes the portion(s) to be cooled.

In the first invention and second invention, there are no particular restrictions on the method for maintaining the portion of the organic crystal that is being worked or the portions of the organic crystal and the substance holding this organic crystal that are being worked in a low-temperature state, and any method may be used. However, in order to obtain a low cooling temperature easily, cooling by the jetting of a low-temperature gas is preferable. The term "indirectly" refers to the jetting of a gas onto a container that accommodates the portion being worked, for example.

The fifth invention that is used to achieve the object described above is the fourth invention, wherein the low-temperature gas is either a nitrogen gas or helium gas.

In cases where some type of observation is performed on the worked crystal, it is desirable that the temperature of the crystal during working be close to the temperature of the crystal during observation. When an organic crystal is observed at a low temperature, it is often the case that a low-temperature gas using nitrogen or helium is caused to jet so that the crystal is set at a targeted temperature. Therefore, it is preferable that a nitrogen gas or helium gas, which is the same as the low-temperature gas used during observation, be employed as the low-temperature gas for cooling the portion of the organic crystal being worked or the portions of the organic crystal and the substance holding this organic crystal being worked to a low temperature. In cases where a nitrogen gas is used, the preferable cooling temperature for the portion being worked is −200° C. to −150° C. Furthermore, there are cases in which observation is performed under super-low temperature conditions by the jetting of an extremely low-temperature gas that uses helium, and in such cases, −270° C. to −250° C., which are close to the observation temperature, are desirable.

The sixth invention that is used to achieve the object described above is any of the first through fifth inventions, wherein the organic crystal is at least one crystal selected from a set consisting of organic low molecules, organic supramolecular complexes, resins, proteins, sugars, lipids and nucleic acids.

Organic crystals consisting of such materials are often brittle, and tend to be completely destroyed if subjected to even a small shear force. Furthermore, if such organic crystals are subjected to a large temperature change over and over, the crystal structure is altered, so that these crystals are often damaged. Accordingly, these are materials for which the application of the first through six inventions is especially effective.

The seventh invention that is used to achieve the object described above is any of the first through sixth inventions, wherein the form of working is working that is performed from the surface of the organic crystal.

Working of the interior of the object of working may be cited as one form of working using a pulsed laser. It is known that such working is made possible, for example, by using pulsed light on the femtosecond order (less than one picosecond) in which the pulse peak value is extremely high. When femtosecond pulsed light is focused on the interior of the object of working, even if the object of working is transparent (i.e., does not have linear absorption) at the wavelength of the irradiating light, energy is absorbed at the focal point, so that working is possible. However, in cases where a brittle material such as an organic crystal is the object of working, the object of working may be damaged by impact during the working of the interior. Accordingly, it is desirable that working be performed only from the surface side. For instance, conceivable forms of working from the surface include cutting, partial removal, boring of holes, modification, pulverization, and the like.

The eighth invention that is used to achieve the object described above is any of the first through seventh inventions, wherein the wavelength of the short-pulse laser light is shorter than the absorption end on the short-wavelength side of the organic crystal.

Working from the surface of the crystal can be reliably accomplished by using short-pulse laser light in which the wavelength of this short-pulse laser light is shorter than the absorption end on the short-wavelength side of the organic crystal constituting the object of working, and the organic crystal has linear absorption.

The ninth invention that is used to achieve the object described above is any of the first through eighth inventions, wherein the wavelength of the short-pulse laser light is 400 nm or less.

Since the wavelength of ultraviolet light is short, the photon energy is high, so that working that directly cleaves the chemical bonds of organic crystals is possible. Working by means of carbon dioxide gas lasers (wavelength 10.6 µm), YAG lasers (wavelength 1.06 µm), or the like that are widely used as the light source for laser working is thermal working, so that the object of working undergoes a great temperature elevation when irradiated with laser light. In the case of working of materials in which thermal denaturation needs to be avoided, working by means of such infrared lasers are unsuitable. Specifically, preferable short-pulse laser light has a level of energy that makes it possible to perform most of the working by means of irradiation with such laser light by directly cleaving and volatilizing the chemical bonds of organic crystals; the maximum value of the wavelength of such laser light varies according to the organic crystal that is the object of working. Laser light that is used to perform most of the working by means of fusion caused by heat is not included. Accordingly, the low-temperature cooling in the present invention is not for the purpose of suppressing the effect of heat generation during irradiation with laser light.

C—N bonds are often present in organic materials; accordingly, in order to cleave the C—N bonds in such cases, it is desirable that the wavelength of the irradiating ultraviolet short-pulse laser light be 400 nm or less. Furthermore, if the secure cleaving of C—C bonds is taken into consideration, it is desirable that this wavelength be 340 nm or less. In cases where organic materials are proteins, in particular, a wavelength of 300 nm or less having linear absorption is preferable.

In terms of energy, there is no particular need to restrict the lower limit of the wavelength of the ultraviolet short-pulse laser light. However, if this wavelength is less than 190 nm, absorption by oxygen in the atmosphere is increased; accordingly, it is desirable that this wavelength be 190 nm or greater. Currently, furthermore, easily obtainable optical elements do not allow the passage of light with a wavelength of less than 150 nm; accordingly, it is desirable to use ultraviolet short-pulse laser light with a wavelength of 150 nm or greater.

Working by means of such ultraviolet short-pulse laser light irradiation is basically working that cleaves and volatilizes molecular bonds by means of photon energy; accordingly, shear forces do not act on the worked surfaces during working. As a result of this superior property, extremely brittle materials such as organic crystals can be worked without crumbling, so that clean worked surfaces can be obtained.

The tenth invention that is used to achieve the object described above is any of the first through ninth inventions, wherein the pulse width of the ultraviolet short-pulse laser light is 100 ns or less.

If the pulse width of the ultraviolet short-pulse laser light exceeds 100 ns, the deleterious effects of heat generation cannot be ignored in some cases depending upon the object of working. Therefore, it is desirable that the pulse width be 100 ns or less.

The eleventh invention that is used to achieve the object described above is any of the first through tenth inventions, wherein the energy density per pulse of the short-pulse laser light is 1 mJ/cm² or greater.

In the working process using short-pulse laser light, the working characteristics are greatly influenced by the energy density per pulse (fluence) of the irradiating short-pulse laser light. Generally, the amount of working per pulse of the laser light (i.e., the working rate) does not show linearity with respect to the fluence. In cases where the fluence is too small, even if the chemical bonds are cleaved, the subsequent volatilization is insufficient, so that working cannot be performed appropriately. Specifically, a fluence that is equal to or greater than a certain threshold value is necessary in order to start working. In the case of a fluence that is equal to or greater than this threshold value, the working rate increases with an increase in the fluence. Accordingly, in order to obtain good working characteristics, it is desirable that the fluence of the irradiating short-pulse laser light be appropriately adjusted.

The appropriate fluence mentioned above depends on the absorption coefficient of the object of working with respect to the irradiating light. As the absorption coefficient increases, more photons are absorbed per unit volume, so that the chemical bonds are cleaved more efficiently. Consequently, the value of the fluence constituting the threshold value of workability is reduced. The absorption coefficients of organic crystals vary greatly according to the material and the wavelength; therefore, the appropriate fluence cannot be completely determined. In the wavelength range of 400 nm or less, however, a fluence of 1 mJ/cm² or greater can be employed. By performing short-pulse laser irradiation at this appropriate fluence, it is possible to cause the effects of working to extend over a region with a depth of 1 nm or greater from the surface of the object of working for each pulse of laser light.

The twelfth invention that is used to achieve the object described above is an organic crystal working apparatus for working organic crystals, wherein this organic crystal working apparatus has a short-pulse laser, an optical system which conducts the short-pulse laser light emitted from this short-pulse laser to an organic crystal constituting the object of working, and which irradiates the location of this organic crystal that is being worked, a mechanism that varies the relative positions of the optical system and the organic crystal, and a means for cooling the object of working to a low temperature.

In this invention, by using a mechanism that varies the relative positions of the optical system and the organic crystal, and irradiating the location of the organic crystal being worked with short-pulse laser light, it is possible to work the organic crystal into a specified shape while varying the relative positions of the optical system and organic crystal. Furthermore, since there is a means for cooling the object of working, working of the object of working can be performed by the methods typified by the first and second inventions.

The thirteenth invention that is used to achieve the object described above is the twelfth invention, wherein the means for maintaining the object of working in a low-temperature state is a means in which a low-temperature gas is caused to jet onto the organic crystal or a container holding this organic crystal in a position where this organic crystal is being worked.

In this invention, working can be performed while implementing the fourth invention inside the apparatus.

The fourteenth invention that is used to achieve the object described above is the twelfth invention, wherein the means for maintaining the object of working in a low-temperature state is a cooling container that accommodates the organic crystal or a container holding this organic crystal in a position where this organic crystal is being worked.

In this invention, working can be performed by accommodating the organic crystal or the holding container for this organic crystal in a cooling container and cooling this organic crystal.

The fifteenth invention that is used to achieve the object described above is any of the twelfth through fourteenth inventions, wherein this organic crystal working apparatus has an observation device or measuring device for observing or measuring the position where the short-pulse laser light is irradiated, simultaneously with the organic crystal.

In this invention, the position where the short-pulse laser light is focused can be observed or measured simultaneously with the organic crystal; accordingly, the location on the organic crystal that is being irradiated with the short-pulse laser light can be observed or measured; as a result, desired working can easily be performed.

The sixteenth invention that is used to achieve the object described above is the fifteenth invention, wherein the observation device or measuring device is an optical observation device or optical measuring device using visible light, this observation device or measuring device is in a mechanically fixed relationship with the optical system, the reference point of the observation device or measuring device coincides with the position where the short-pulse laser light is irradiated, and the apparatus has the function of indirectly observing or measuring this short-pulse laser light irradiation position by observing or measuring the position of the reference point of the observation device or measuring device.

In cases where the irradiating laser light is ultraviolet short-pulse laser light, the irradiation position cannot be observed or measured unless a special light transducer or photodetector is used. Accordingly, the irradiation point on the object of working cannot be ascertained. In the present invention, therefore, a reference point (ordinarily three-dimensional) is provided on the side of the observation device or measuring device, and the system is devised so that the ultraviolet short-pulse laser light is focused on this reference point, and so that this reference point is observed simultaneously with the object of working. Accordingly, the ultraviolet short-pulse laser light irradiation position on the object of working can be ascertained by means of visible light. In the reference position, for example, scale lines can be provided in two dimensions perpendicular to the optical axis of the observation device or measuring device to form a reference position, and the focal position can be taken as the reference position in the direction of the optical axis.

The seventeenth invention that is used to achieve the object described above is an organic crystal observation device, wherein the organic crystal working apparatus of any of the twelfth through sixteenth inventions is incorporated.

In cases where the organic crystal is observed in a low-temperature state, if an operation in which the organic crystal is returned to an ordinary temperature is performed for the purpose of working, there may be cases in which the organic crystal is damaged or the structure is altered due to a large temperature change. In this invention, the organic crystal working apparatus of the present invention is incorporated into the organic crystal observation means, so that observation can be quickly performed without subjecting the object of observation to a large temperature change before and after working.

The eighteenth invention that is used to achieve the object described above is the seventeenth invention, wherein the observation device is an X-ray crystal structure analysis device.

X-ray crystal structure analysis devices are one of the observation devices most commonly used for the structural analysis of organic crystals. In addition, the organic crystal working apparatus of the present invention is incorporated, so that observation can be immediately performed when working is completed, and the structural analysis of organic crystals can be accurately performed. The organic crystal working apparatus of the present invention can also be incorporated into observation devices such as electron diffraction devices and neutron diffraction devices, besides X-ray diffraction devices.

Furthermore, the "X-ray crystal structure analysis devices" referred to in the present specification and claims include structure analysis devices using synchrotron orbital radiation.

BEST MODE FOR CARRYING OUT THE INVENTION

Figure 1:
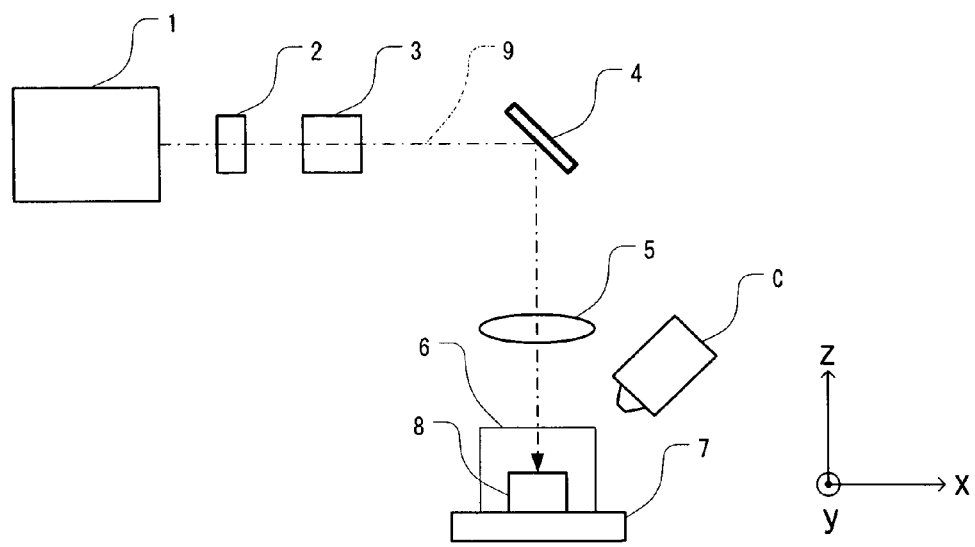
FIG. 1 is a schematic diagram of an organic crystal working apparatus constituting one working configuration of the present invention.

Working configurations of the present invention will be described below with reference to the figures. FIG. 1 is a schematic diagram of an organic crystal working apparatus constituting one working configuration of the present invention. The short-pulse laser light 9 that is emitted from a short-pulse laser light source 1 is focused on and caused to irradiate an organic crystal 8 that is placed in a sample container 6 via a shutter 2, an intensity adjusting element 3, an irradiation position control mechanism 4 and a focusing optical system 5. The sample container 6 is mounted on a stage 7, and can be moved in three dimensions along the x axis, y axis and z axis in an x-y-z orthogonal coordinate system, with the direction of the optical axis taken as the z axis. Furthermore, this sample container 6 can be rotated about the z axis. Moreover, in cases where it is desired to achieve a wider variety of worked shapes, a construction may also be used in which rotation about the x axis or y axis is made possible in addition to the z axis. Working of the organic crystal is performed by the short-pulse laser light that is focused on and caused to irradiate the surface of the organic crystal 8. Prior to the working, nitrogen is caused to jet onto the sample container 6 by a low-temperature gas jet device C constituting a cooling device; as a result, the organic crystal 8 is cooled to −150° or below.

As was described above, organic crystals include crystals that have C—N bonds, and in order to cleave such C—N bonds in these crystals and to perform working, it is desirable that the wavelength of the laser light used be 400 nm or less. On the other hand, the various types of optical element required for irradiation with laser light do not efficiently pass light that has a wavelength of less than 150 nm. Consequently, the use of laser light with a wavelength of less than 150 nm is undesirable. Accordingly, the desirable wavelength range of the irradiating laser light is 150 nm to 400 nm. Furthermore, if the secure cleavage of C—C bonds is taken into consideration, it is desirable that the wavelength be 340 nm or less. On the other hand, if the wavelength of the laser light is less than 190 nm, there is absorption by oxygen in the atmosphere; accordingly, the following problem arises: namely, propagation of the laser light in air becomes difficult. In other words, an even more desirable wavelength of the ultraviolet short-pulse laser light is in the range of 190 nm to 340 nm.

Figure 2:
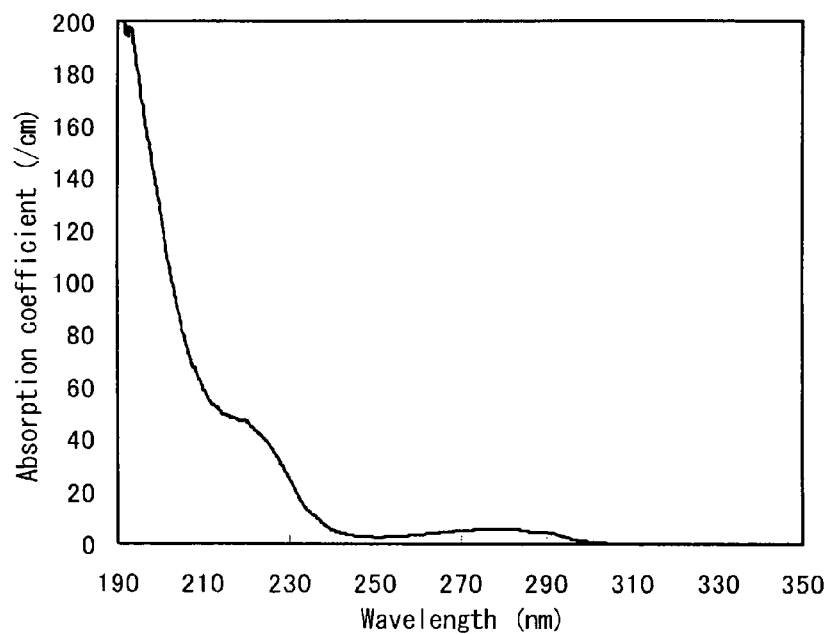
FIG. 2 is a diagram showing the absorption coefficients in the ultraviolet region of an aqueous solution of egg white lysozyme (1 mg/ml).

The absorption of light by organic materials will be described using proteins as an example. FIG. 2 shows the absorption coefficients in the ultraviolet region of an aqueous solution (1 mg/ml) of chicken egg white lysozyme, which is a typical protein. At 300 nm or less, the absorption begins to increase. First, there is a peak in the vicinity of 270 nm to 280 nm; then, after the absorption drops slightly in the vicinity of 250 nm, the absorption shows an abrupt increase as the wavelength becomes shorter.

In the wavelength range of 300 nm or less, the irradiating light has a great effect on bonds in the protein molecules, and is efficiently absorbed by the surface layer without invading the interior of the crystal. Accordingly, degradation proceeds only in the surface portions that are irradiated by the light, so that working can be performed with little effect on surrounding areas. Specifically, an even more desirable wavelength of the short-pulse laser light in protein materials is 300 nm or less. With regard to the changes in protein crystal working characteristics caused by the differences in the irradiating laser wavelengths, embodiments are cited in the invention of the previous application, and the change in the working characteristics is the same (zero) even in a low-temperature cooled state.

$F_2$ lasers, ArF excimer lasers, KrF excimer lasers, XeCl excimer lasers, XeF excimer lasers, and the like can be cited as examples of gas lasers that can be used. Furthermore, as examples of the use of higher harmonics of laser light, the third harmonic, fourth harmonic, fifth harmonic and sixth harmonic of Nd:YAG lasers, the third harmonic, fourth harmonic, fifth harmonic and sixth harmonic of Nd:YVO$_4$ lasers, the second harmonic, third harmonic, fourth harmonic and fifth harmonic of Ti:S lasers, the fourth harmonic, fifth harmonic, sixth harmonic, seventh harmonic and eighth harmonic of erbium-added fiber lasers, the third harmonic, fourth harmonic, fifth harmonic and sixth harmonic of ytterbium-added fiber lasers, the second harmonic and third harmonic of Ar ion lasers, and the like can also be used.

These harmonic generation circuits are universally known; one example will be described with reference to FIG. 3. This is a solid laser apparatus which generates light with a wavelength of 193 nm; in this apparatus, light from a semiconductor laser with a wavelength of 1547 nm is amplified by a fiber amplifier, semiconductor amplifier, or the like, and this amplified fundamental wave of 1547 nm is converted in wavelength to the eighth harmonic by a wavelength-converting optical system to produce light with a wavelength of 193 nm. The semiconductor laser and light amplifying parts such as the fiber amplifier will not be described here; however, these parts are described, for example, in Japanese Patent Application Kokai No. 2000-200747, and are therefore publicly known.

Figure 3:
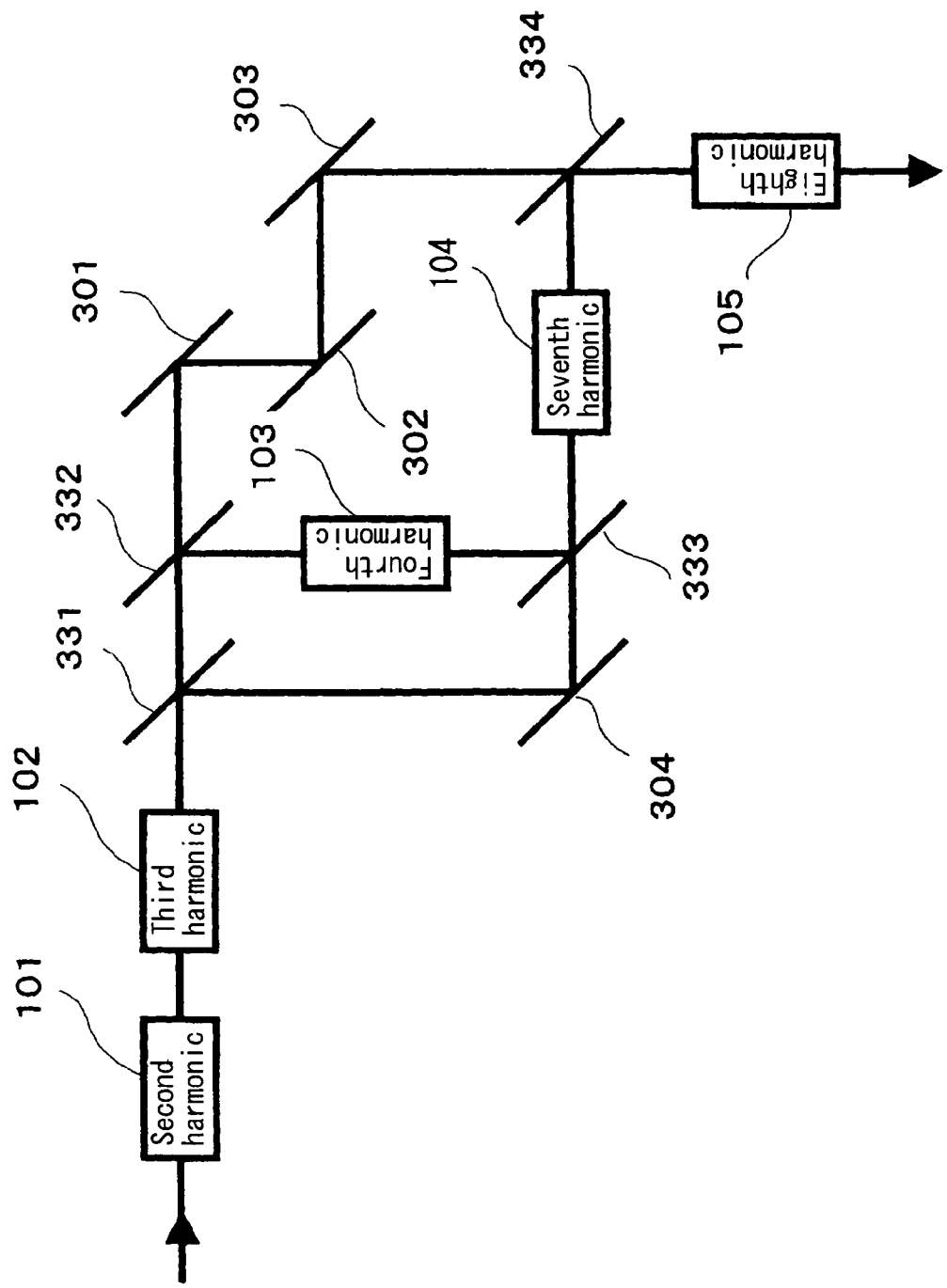
FIG. 3 is a diagram showing an example of the harmonic generation circuit.

In FIG. 3, the fundamental wave amplified by the fiber amplifier or the like is incident on a wavelength converting crystal 101, so that the wavelength of a portion of the light of the fundamental wave is converted into the second harmonic. Examples of the wavelength converting crystal 101 include LBO ($LiB_3O_5$), PPLN (periodically poled $LiNbO_3$), PPKTP (periodically poled $KTiOPO_4$), and the like.

The fundamental wave and second harmonic that are emitted from the wavelength converting crystal 101 are incident on a wavelength converting crystal 102, so that portions of the fundamental wave and second harmonic are converted in wavelength to the third harmonic. Examples of the wavelength converting crystal 102 include LBO, PPLN, PPKTP, and the like.

The light of the fundamental wave, second harmonic and third harmonic emitted from the wavelength converting crystal 102 is incident on a dichroic mirror 331. The fundamental wave and second harmonic pass through, while the third harmonic is reflected. The second harmonic that passes through the dichroic mirror 331 is reflected by a dichroic mirror 332, and is incident on a wavelength converting crystal 103, so that a portion of the second harmonic is converted in wavelength to the fourth harmonic. Examples of the wavelength converting crystal 103 include LBO, PPLN, PPKTP, and the like.

The fourth harmonic that is emitted from the wavelength converting crystal 103 is reflected by a dichroic mirror 333, so that this harmonic is substantially coaxial with the third harmonic that has been reflected by the dichroic mirror 331 and mirror 304 and passed through the dichroic mirror 333. This light is then incident on a wavelength converting crystal 104, so that portions of the third harmonic and fourth harmonic are converted in wavelength to the seventh harmonic. Examples of the wavelength converting crystal 104 include BBO ($\beta$-$BaB_2O_4$) and the like.

The seventh harmonic that is emitted from the wavelength converting crystal 104 is reflected by a dichroic mirror 334, so that this harmonic is substantially coaxial with the fundamental wave that has passed through the dichroic mirrors 331 and 332, has been reflected by the mirrors 301, 302 and 303, and has passed through the dichroic mirror 334. This light is then incident on a wavelength converting crystal 105. Then, portions of the fundamental wave and seventh harmonic are converted in wavelength to light having a wavelength of 193 nm, which is the eighth harmonic. Examples of the wavelength converting crystal 105 include LBO, CLBO ($CsLiB_6O_{10}$), BBO, and the like. However, the crystal used is not limited to these.

Furthermore, in the optical system shown in FIG. 3, the depiction of lenses and wavelength plates is omitted; in the actual optical system, however, these parts are disposed in desired locations. If a portion of this optical system is used, the second harmonic, third harmonic, fourth harmonic and seventh harmonic can also be formed. Circuits that form the fifth harmonic and sixth harmonic are separate; however, since these circuits are publicly known, a description is omitted. Moreover, the optical system shown in FIG. 3 is taken as a part of the short-pulse laser light source 1 shown in FIG. 1.

It is desirable that the laser light that irradiates the object of working be short-pulsed light rather than continuous light. Laser working by means of continuous light is basically thermal working; for the reasons described above, this is not suitable for the working of organic crystals in which damage due to heat generation is a problem. Furthermore, it is desirable that the pulse time width of the pulsed light be short; in quantitative terms, it is desirable that the full width at half maximum be 100 ns or less. If this value exceeds 100 ns, there are cases in which the deleterious effects of heat generation cannot be ignored. A pulse width of 100 fs to 10 nm is even more desirable; a so-called nanosecond pulsed laser, picosecond pulsed laser or femtosecond pulsed laser can be used for this.

In the process of working by means of short-pulse laser light, the working characteristics are greatly influenced by the energy density (fluence) per pulse of the irradiating short-pulse laser light. Generally, the amount of working per pulse of the short-pulse laser light (i.e., the working rate) does not show a linear response to the fluence. In cases where the fluence is too small, even if the chemical bonds are cleaved, the subsequent volatilization is insufficient, so that working cannot be performed. Specifically, a fluence that is equal to or greater than a certain threshold value is required in order to start working by means of short-pulse laser light. At fluence values that are equal to or greater than this threshold value, the working rate increases with an increase in the fluence. Accordingly, in order to obtain favorable working characteristics, the fluence of the irradiating short-pulse laser light must be appropriately adjusted.

The appropriate fluence mentioned above depends on the absorption coefficient of the object of working with respect to the irradiating light. As the absorption coefficient increases, more photons are absorbed per unit volume, so that chemical bonds are cleaved more efficiently. Accordingly, the value of the fluence that constitutes the working threshold value decreases. As is shown in one example illustrated in FIG. 2, the absorption coefficients of organic materials vary greatly according to the wavelength; therefore, the appropriate fluence varies according to the wavelength of the irradiating light. Furthermore, since the absorption coefficients also vary greatly according to the type of organic material, the appropriate wavelength range of laser light varies according to the type of organic material.

For the crystals of biomolecular materials, a desirable fluence that can be used in the wavelength range of 150 nm or greater but less than 210 nm is 1 $mJ/cm^2$ or greater, a desirable fluence that can be used in the wavelength range of 210 nm or greater but less than 240 nm is 10 $mJ/cm^2$ or greater, a desirable fluence that can be used in the wavelength range of 240 nm or greater but less than 300 nm is 100 $mJ/cm^2$ or greater, and a desirable fluence that can be used in the wavelength range of 300 nm to 400 nm is 1 $J/cm^2$ or greater.

By performing short-pulse laser light irradiation at the appropriate fluence described above, it is possible to cause the effects of working to extend over a region having a depth of 1 nm or greater from the crystal surface (per pulse of ultraviolet short-pulse laser light).

Irradiation with short-pulse laser light may be performed in a single emission, or a plurality of emissions may be repeated. The working speed in cases where irradiation with a plurality of pulses is performed varies according to the pulse repetition frequency. If the repetition frequency is too small, a high working speed cannot be obtained. On the other hand, if the repetition frequency is too large, there is a possibility that deleterious effects arise due to heat generation. From the standpoint of achieving both a favorable working speed and favorable working characteristics, a pulse repetition frequency of 1 Hz to 10 MHz is preferable. Accordingly, in cases where the same location on the object of working is irradiated with a plurality of pulses of the short-pulse laser light, the time interval of the light pulses irradiating the same location is 100 ns or longer. Furthermore, the pulse repetition frequency can also be varied appropriately during working.

In cases where irradiation is performed by repeating a plurality of laser light pulses, the number of irradiating pulses can be freely set in accordance with the purpose of working. Therefore, there are no particular restrictions on the total irradiation time.

The number of irradiating pulses applied to the organic crystal can be controlled by means of the shutter 2 that is disposed between the short-pulse laser light source 1 and the organic crystal 8. More desirable working conditions can be achieved by irradiating the organic crystal with only the number of light pulses required for the respective purposes of working.

The intensity of the irradiating light applied to the organic crystal can be adjusted by means of the intensity adjusting element 3. A combination of a polarizer and a half-wavelength plate or the like can be used as this means. In cases where the working of an area larger than the diameter of the laser spot is performed by irradiation with a plurality of light pulses or the like, working is performed while causing the laser spot position to move relative to the object of working. The first method used in this case is a method in which the stage 7 is appropriately moved. The second method is a method in which the laser spot position on the organic crystal 8 is scanned in the direction perpendicular to the optical axis using the irradiation position control mechanism 4. The irradiation position control mechanism 4 may be a galvano-mirror, polygonal mirror, acoustic-optical deflector, or the like. It would also be possible to move both the laser spot position and the position of the organic crystal 8 by using both of the two methods described above simultaneously. In cases where working is performed while moving the laser spot position relative to the organic crystal 8, the relative speed can be appropriately set in accordance with the repetition frequency of the irradiating light, the absorption coefficient of the object of working, and the like.

In cases where the working described above is performed while causing the object of working to rotate relative to the short-pulse laser light, working can be performed while rotating the object of working by rotating the stage 7. The desirable relative rotational speed depends on the repetition frequency of the irradiating light, the absorption coefficient of the organic crystal, and the like.

By causing the laser spot position to move and rotate relative to the object of working, various worked shapes can be achieved. Concrete directions of movement and rotation and an example of the worked shape obtained in the case of working into a shape that has a cylindrical surface or spherical surface, in particular, will be described based on a case in which the organic crystal is irradiated with short-pulse laser light from the direction of the z axis in the x-y-z orthogonal coordinate system as shown in FIG. 1.

In the first method, the organic crystal 8 is irradiated in a state in which the short-pulse laser light is fixed while rotating the organic crystal 8 with respect to the z axis. In the second method, the organic crystal 8 is in a fixed state, and irradiation with short-pulse laser light is performed while scanning the laser spot position on the organic crystal 8 in a circular manner in the XY plane using the irradiation position control mechanism 4. A cylindrical surface taking the direction of the z axis as the rotational central axis can be formed by using such a first method or second method.

In the third method, irradiation is performed with the short-pulse laser light being in a fixed state while causing the stage 7 to move as appropriate in the x axis and y axis. In the fourth method, irradiation with the short-pulse laser light is performed while appropriately moving the laser spot position on the organic crystal 8 in the XY plane. A partially cylindrical surface or a partially spherical surface taking the direction of the x axis or y axis as the rotational central axis can be formed by using such a third method or fourth method.

The fifth method is a method in which an operation causing the organic crystal 8 to rotate with respect to the x axis or y axis is added to one of the first through fourth methods described above. A spherical surface can be formed by using this fifth method.

In the third method or fourth method, since working cannot be performed on the surface of the organic crystal 8 on the side opposite from the laser irradiated surface, only a partially spherical surface can be formed. However, by adding the operation in which the organic crystal 8 is caused to rotate with respect to the x axis or y axis, the formation of a spherical surface becomes possible over the entire surface of the object of working.

In all of the methods described above, it would also be possible to alternately repeat a series of steps in which irradiation with short-pulse laser light is performed for a specified period of time in a state in which the organic crystal 8 and laser spot position are fixed, the irradiation with short-pulse laser light is stopped, and the object of working is then caused to move and rotate in relative terms. Moreover, a plurality of methods may also be used in combination.

Furthermore, the operational methods and resulting worked shapes described above are part of an example of worked shapes that can be achieved using the present working apparatus; various worked shapes having a flat surface or a non-spherical curved surface can be achieved by appropriately combining the translational movement and rotational movement.

The short-pulse laser light 9 can be focused on the organic crystal in spot form, linear form, or the like by using an image focusing optical system. The spot diameter of the laser light on the surface of the object of working can be appropriately varied according to the type and shape of the object of working and the purpose of working. The focusing optical system 5 that is used may consist of reflective mirrors for irradiating light, lenses and prisms that can efficiently transmit irradiating light, or the like.

The short-pulse laser light 9 can also be propagated using optical fibers. It is necessary that the optical fibers consist of materials that efficiently transmit the laser light that is used, and that these optical fibers have a strength which is such that the fibers are not destroyed by the light that is introduced. The shape of the optical fibers may also be hollow. The output light from the optical fibers may irradiate the object of working directly, or may irradiate the object of working after being focused by a lens or the like.

The organic crystals constituting the object of working include materials that contain moisture within the crystals, and are therefore vulnerable to dryness, as is the case with protein crystals. In such cases, in order to prevent degeneration caused by drying or damage to the crystals, a state in which the crystal is disposed in a crystal growth solution or preservative solution, a state in which the crystal is disposed in a sealed vessel, or the like, can be cited as the desirable crystal state during working at ordinary temperatures. In the present invention, in contrast, since the crystal is placed in a low-temperature frozen state by nitrogen that is caused to jet by a low-temperature gas jet device C, there is no evaporation of water in the crystal, so that problems caused by drying can be avoided.

Figure 4:
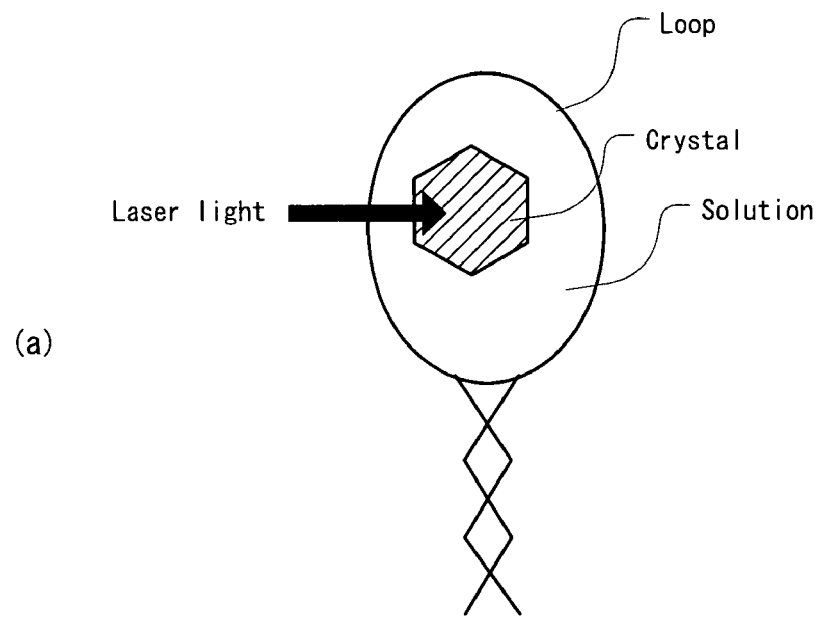
FIG. 4 is a diagram showing examples of the conditions under which the organic crystal object of working is worked.
Figure 4:
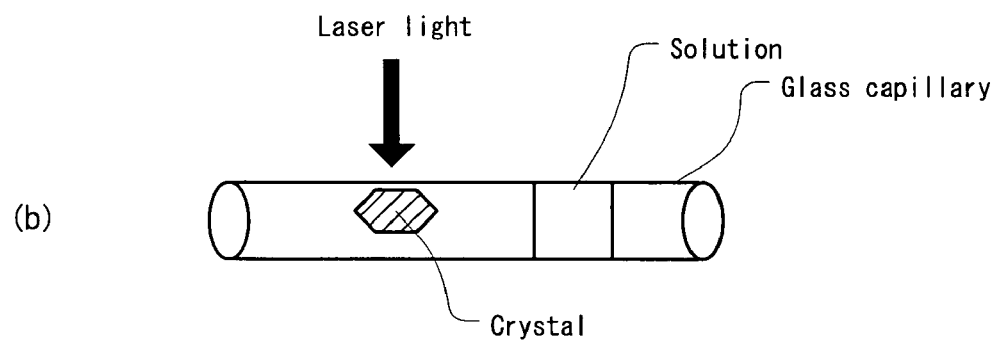
Figure 4:
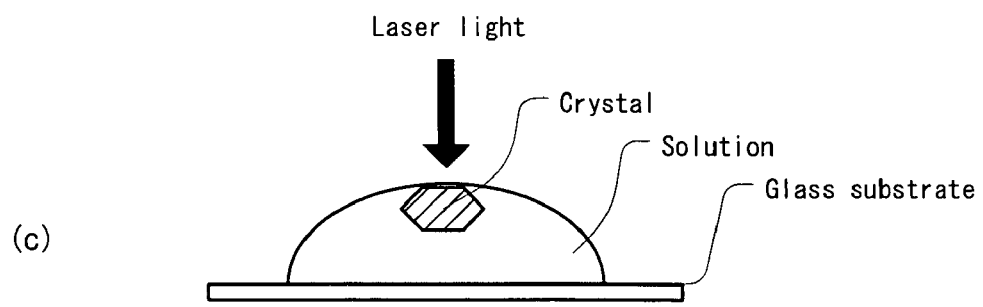

FIG. 4 shows examples of the conditions under which the organic crystal object of working that is vulnerable to dryness but that is present in a liquid in a stable manner at an ordinary temperature is worked. Furthermore in cases where the organic crystal is held as described in (a) through (c) below, laser light irradiation may also be performed with these crystals placed in a sample container together with the holding device.

(a) indicates a method in which an organic crystal that is present in a liquid is scooped up with a loop, so that the liquid is formed into a thin film by surface tension, and working is then performed by directly irradiating the organic crystal with short-pulse laser light. If this loop is placed at a low temperature in this state, the liquid that is formed into a thin film and the organic crystal are cooled and frozen. Working is performed in this state by irradiation with laser light as indicated by the arrow.

In this case, since the organic crystal is constrained merely by an extremely weak force of surface tension, if working is to be performed in an unfrozen state, there is a danger that the organic crystal constituting the object of working swings by means of a faint force when the volatilized material generated during working is emitted, so that the worked surface does not become as planned, and that the thin liquid film will break when the worked surface reaches the portion of the solution. Furthermore, in cases where the liquid adheres to the surface of the organic crystal, if the organic crystal is worked without being frozen, there may be cases in which desired working cannot be achieved as a result of movement of the adhering liquid. However, such problems can be solved by performing working by freezing the organic crystal.

(b) indicates a method in which an organic crystal is accommodated inside a capillary that efficiently transmits short-pulse laser light, and working is performed by irradiating the organic crystal with short-pulse laser light via the capillary. In this case as well, when a liquid adheres to the surface of the organic crystal, if working is performed without cooling the organic crystal and the liquid on the surface, there may be cases in which efficient working of the organic crystal is difficult as a result of movement of the liquid. However, such a problem can be solved by performing working by freezing the liquid on the surface of the crystal.

(c) indicates a method in which droplets of liquid are formed on a glass substrate, an organic crystal is caused to float on these liquid droplets, and working is performed by irradiating the organic crystal with short-pulse laser light. In this case, since the organic crystal is merely floating on the liquid droplets, if working is performed in a state in which these liquid droplets are unfrozen, there may be cases in which the organic crystal swings by means of a faint force when the volatilized material generated during working is emitted, so that the worked surface does not become as planned; furthermore, in cases where a liquid adheres to the surface of the organic crystal, if working is performed without freezing this liquid, there may be cases in which working cannot be performed efficiently as a result of movement of the liquid. However, such problems can be solved by performing working by freezing the liquid.

An example of an organic crystal present in a liquid in a stable manner at an ordinary temperature has been described above. However, the effect of the present invention is not limited to such a specific organic crystal or to a specific material holding method.

Figure 5:
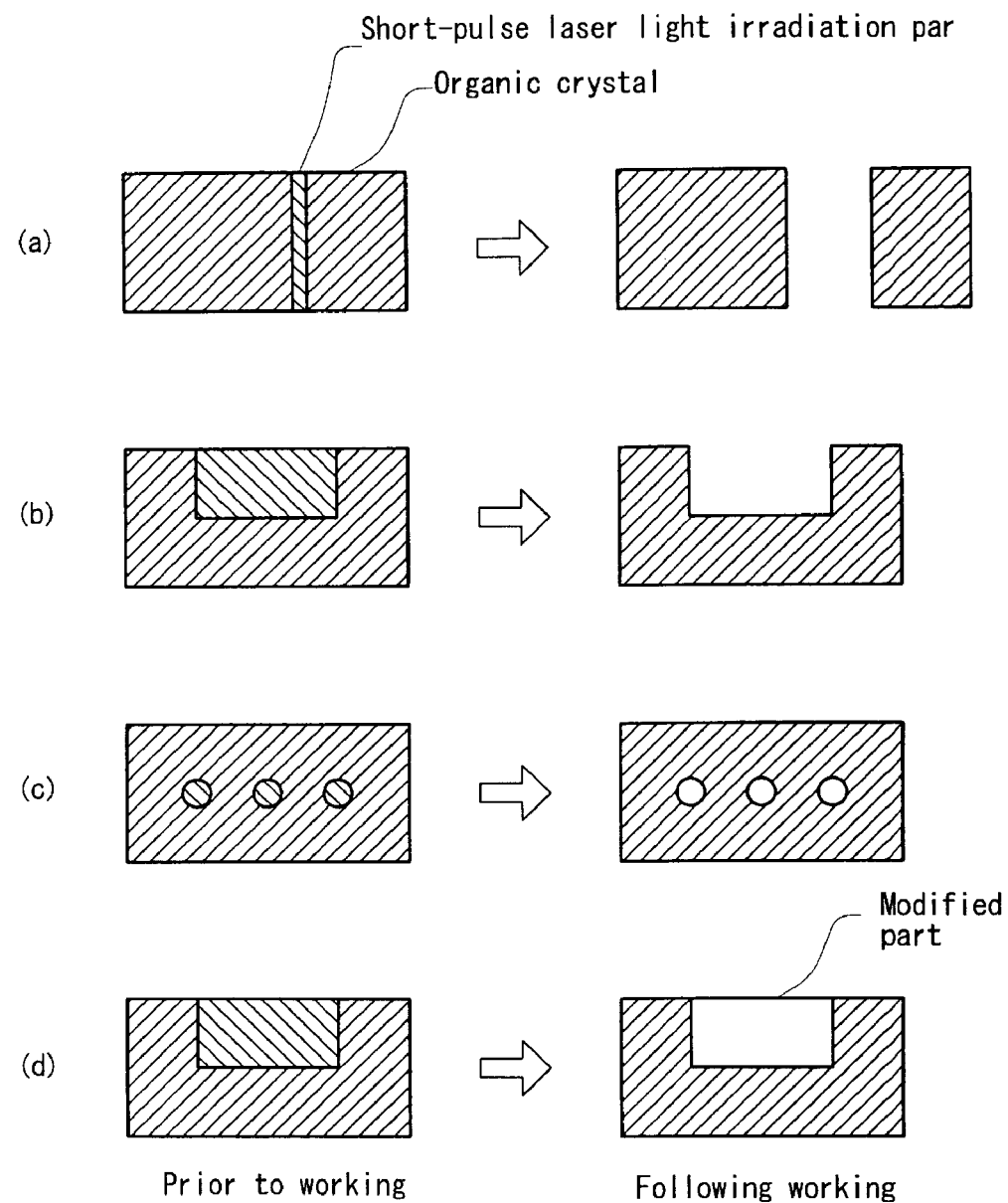
FIG. 5 is a diagram showing examples of the working of the organic crystal.

FIG. 5 shows examples of the working of an organic crystal. (a) indicates cutting; here, cutting is performed by irradiating the cut part with short-pulse laser light so that the chemical bonds of the material are cleaved, and removing the cut part by volatilization. The cut organic crystal can be used for X-ray diffraction measurements, in organic/biodevices, and the like. (b) indicates removal; here, a specified portion of the organic crystal is removed by irradiating a region of a specified shape with short-pulse laser light so that the portion corresponding to this region is volatilized, and performing cutting along the boundaries of this region. The remaining organic crystal can be used for X-ray diffraction measurements, in organic/biodevices, and the like. Furthermore, in the figures from (b) on, the parts showing the same hatching as in (a) respectively indicate the same organic crystal and short-pulse laser light irradiation areas as in (a).

(c) indicates hole boring; here, holes are formed by irradiating specified portions of the organic crystal with short-pulse laser light. The organic crystal in which these holes are formed can be used in organic/biodevices and the like. (d) indicates modification; here, the intrinsic nature of the material in the irradiated area is intentionally lost by irradiating a specified portion of the crystal with short-pulse laser light. This organic crystal can be used for X-ray diffraction measurements, in organic/biodevices, and the like.

A variety of suitable conditions of the organic crystal are obtained following working by using one type or a combination of a plurality of types of these types of working in accordance with the purpose of use for the organic crystal. A case of X-ray diffraction measurements will be described as an example. In X-ray crystal structure analysis, it is desirable that an organic crystal constituting the object of analysis be a single crystal of high quality, and that with respect to the shape, the ratio of vertical and horizontal lengths and height of the crystal be close to 1. Therefore, the crystal being a single crystal without any degeneration or damage is cited as suitable post-working crystal conditions. Next, it is desirable that the shape of this crystal be a cube or a shape closed to a cube, a cylindrical shape or a shape closed to a cylindrical shape, or a spherical shape or a shape closed to a spherical shape.

As another usage, X-ray topography requires measurements to be performed at a diffraction surface having a high diffraction intensity, but this often differs from the natural surface of the crystal. Ordinarily, the sample is held with the crystal being tilted so that the diffraction surface is perpendicular to the X-rays. More preferably, however, the crystal is worked so that the targeted diffraction surface is obtained. Furthermore, in the wavelength conversion of light using a nonlinear effect of the crystal or the like, the crystal is generally used after cutting this crystal at a certain specified angle; in such a case as well, it is preferable to form a shape having a worked surface along a desired direction.

Incidentally, in cases where an organic crystal object of working is worked, it is necessary to confirm the location on the object of working that is irradiated with short-pulse laser light. Therefore, it is desirable to use this system in combination with an observation device using an optical microscope or the like.

Figure 6:
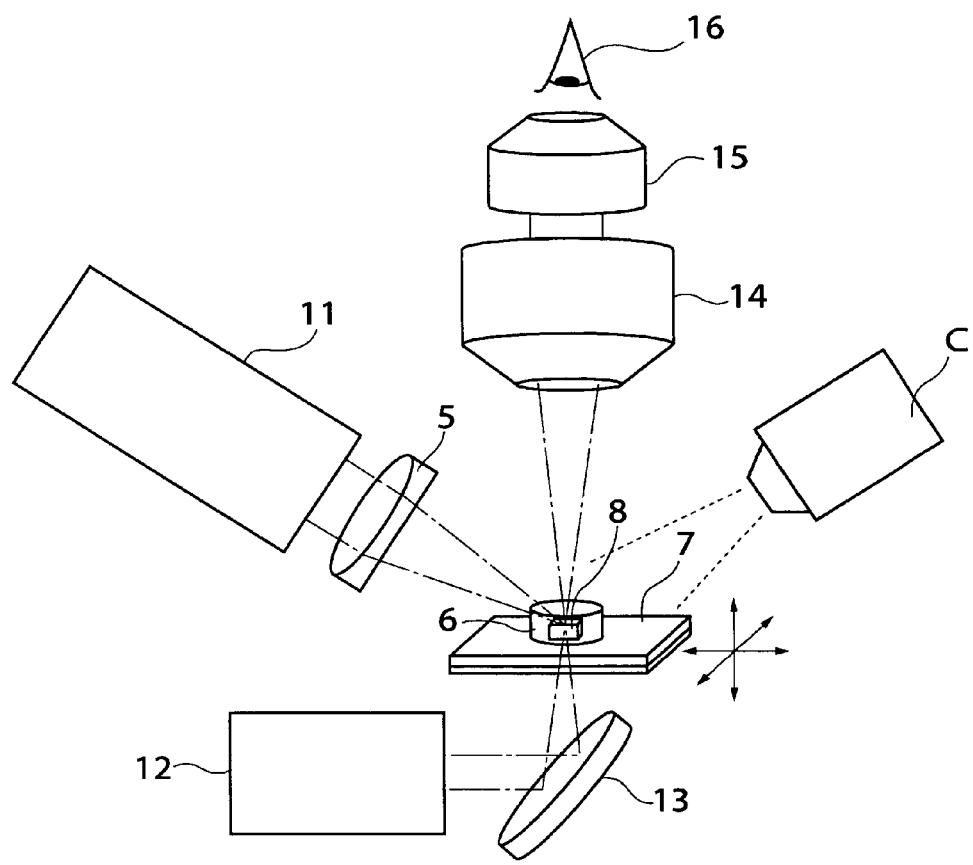
FIG. 6 is a diagram showing an example which is devised so that the short-pulse laser system is used in combination with an optical microscope.

An example of a case in which an optical microscope is used is shown in FIG. 6. In this optical system, a specified location is irradiated with the short-pulse laser light from the short-pulse laser system 11 (corresponding to the symbols 1 through 4 in FIG. 1) via a focusing optical system 5. The stage 7 has the function described in FIG. 1, and a sample container 6 containing the organic crystal 8 is carried on the stage 7. Visible light from an illuminating light source 12 is reflected by a reflective mirror 13, and causes Koehler illumination of the sample container 6. The organic crystal 8 is visually observed by the eye 16 via the object lens 14 and ocular lens 15 of an optical microscope.

A cruciform mark is formed in the position of the optical axis of the optical microscope, so that the position of the optical axis can be visually observed. Furthermore, the focal position (position of the focus, i.e., the object plane that is in focus when visually observed) of the optical microscope is fixed. The system is arranged so that the short-pulse laser light that is focused by the focusing optical system 5 is focused at the position of the optical axis of the optical microscope, and at the focal position of the optical microscope. Accordingly, in cases where the object of working is carried on the stage 7, and an image of this object of working is observed with the optical microscope, the image is focused, and the short-pulse laser light from the short-pulse laser system 11 is focused at a position located at the center of the cruciform mark. Furthermore, the relative positional relationship of the short-pulse laser system 11, focusing optical system 5 and optical microscope part is fixed, with only the stage 7 being able to move relative to these fixed systems.

Accordingly, working of the desired location and working of the desired shape can be accomplished by moving the stage 7 so that the location that is to be worked is positioned at the optical axis position and focal position of the optical microscope. If it is desired to perform working automatically, then it is necessary merely to attach an automatic focus adjustment device to the optical microscope, drive the stage 7 by means of commands from this adjustment device, and drive the stage 7 so that a predetermined specified part of the stage 7 is located on the optical axis of the optical microscope. Alternatively, the system may also be devised so that the stage 7 is driven in two dimensions or three dimensions by a servo mechanism after the reference position is initially aligned.

In this apparatus as well, a low-temperature gas jet device C constituting a cooling device is installed, and the sample container 6 is cooled by nitrogen that is caused to jet from this device; as a result, the organic crystal 8 is cooled to a low temperature. Working is performed in this state while observing the organic crystal 8.

Figure 7:
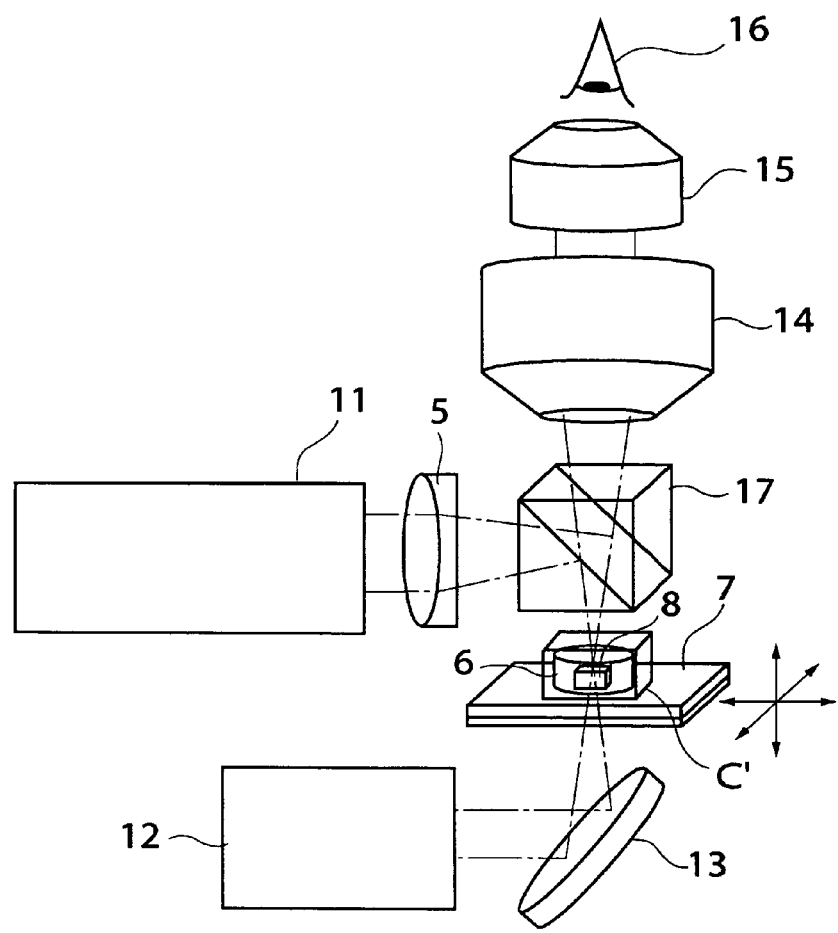
FIG. 7 is a diagram showing an example which is devised so that the short-pulse laser system is used in combination with an optical microscope.

FIG. 7 is a diagram showing another example in which a short-pulse laser system is combined with an optical microscope. In this example, the system is devised so that the short-pulse laser light irradiates the organic crystal along the optical axis of an optical microscope. The short-pulse laser light emitted from the short-pulse laser system 11 passes through a focusing optical system 5, and is then incident on a beam splitter 17 so that this light is reflected and caused to irradiate the organic crystal along the optical axis of the optical microscope. The optical microscope itself has the same construction as that shown in FIG. 6; however, visible light advances directly through the beam splitter 17, and is observed by the eye 16 via an object lens 14 and ocular lens 15. As in the system shown in FIG. 6, the focal position of the short-pulse laser light is located on the optical axis of the optical microscope, and at the focal position of the optical microscope, and the positional relationship of the short-pulse laser system 11, focusing optical system 5 and optical microscope is fixed.

Specifically, the two working configurations differ as follows: namely, in the working configuration shown in FIG. 6, the short-pulse laser light irradiates the organic crystal at an oblique angle, while in the present working configuration, the organic crystal is perpendicularly irradiated. A beam splitter 17 is installed in order to realize this. As a result, the working precision becomes accurate. The remaining functions such as the detection of the irradiation position are the same as in the system shown in FIG. 6; accordingly, a description is omitted.

A low-temperature gas jet device C was used as the cooling device in the working configuration shown in FIG. 6, but a cooling container C' is used as the cooling device in the working configuration shown in FIG. 7. This cooling container C' has a cooling machine inside, or is connected to a cooling machine by piping; this cooling container is constructed so that the interior of this cooling container is cooled to −20° C. or below. The portion where the laser light passes is formed from a material such as quartz that efficiently transmits laser light. Since the sample container 6 is placed inside this cooling container C', the sample container 6 is cooled, and the organic crystal 8 is cooled to a low temperature as a result. Working is performed in this state while observing the organic crystal 8.

Furthermore, as a modification of the construction shown in FIG. 7, a construction is also conceivable in which the beam splitter 17 is disposed between the object lens 14 and ocular lens 15, the object lens 14 is used as a focusing lens, and the focusing optical system 5 is omitted. Moreover, a construction is also conceivable in which the short-pulse laser system 11 and focusing optical system 5 are disposed directly above the stage 7, the organic crystal is perpendicularly irradiated, the object of irradiation is illuminated by means of visible light from beneath the stage 7, and an optical microscope is installed beneath the stage 7.

Figure 8:
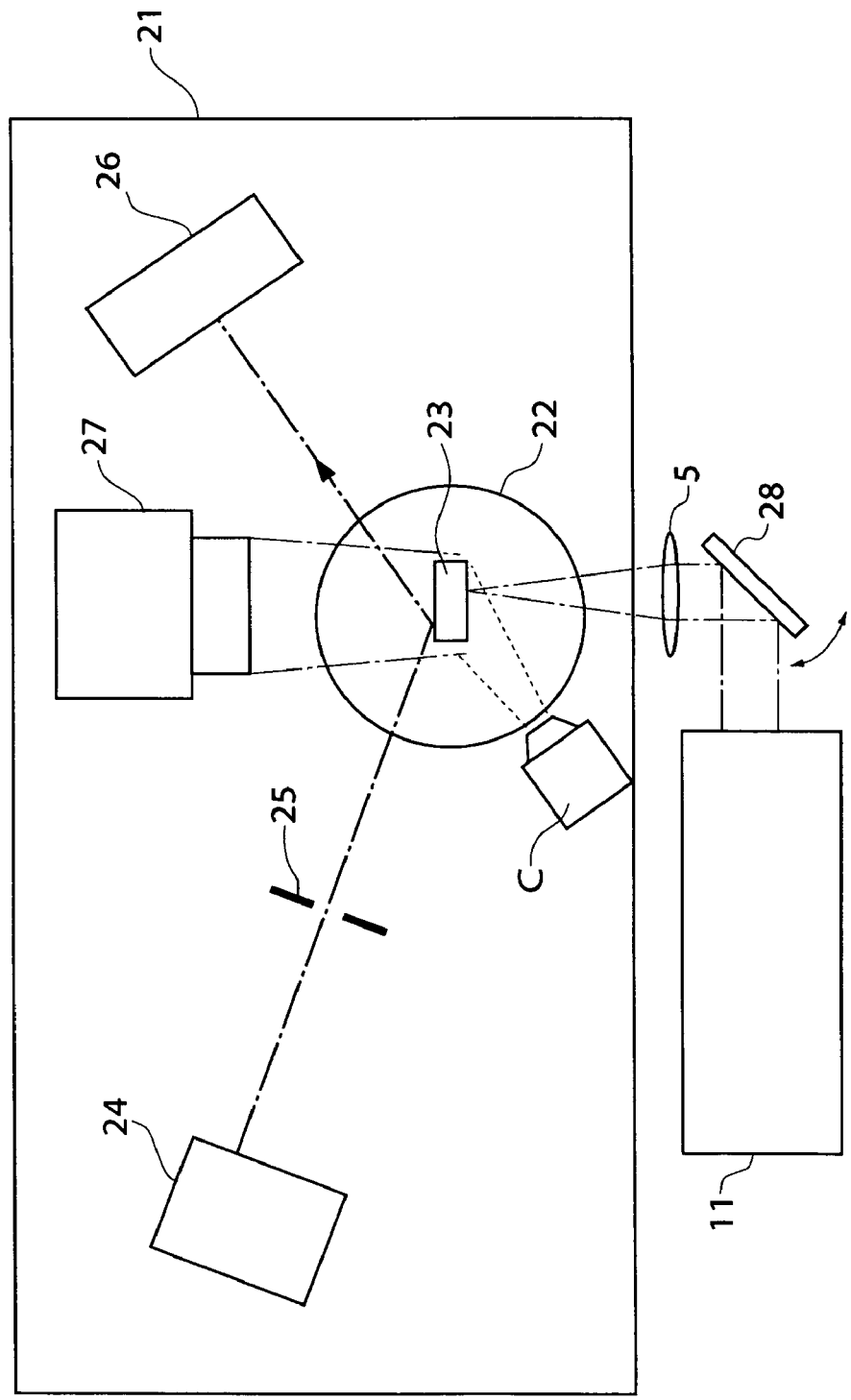
FIG. 8 is a diagram showing an example in which the organic crystal working apparatus is incorporated into an X-ray crystal structure analysis device.

FIG. 8 shows an example in which an organic crystal working apparatus is incorporated into an X-ray crystal structure analysis device which is a sample observation device. A stage 22 is installed in the main body part 21 of the X-ray crystal structure analysis device, and an organic crystal 23 constituting a measurement sample is carried on this stage 22. X-rays from an X-ray generating device 24 are stopped down by a slit 25, and are then caused to irradiate the organic crystal 23; the X-rays diffracted by the irradiated surface are detected by a detector 26, and the X-ray diffraction pattern is observed. A sample monitoring camera 27 is provided for use in the positioning of the sample and the like. In this X-ray crystal structure analysis device as well, a low-temperature gas jet device C constituting a cooling device is installed in order to cool the organic crystal 23 constituting the measurement sample; after the organic crystal 23 is cooled to a low temperature by means of a low-temperature gas that is caused to jet from this device, working and X-ray diffraction are performed, with this cooled state being maintained.

In this working configuration, in the X-ray crystal structure analysis device main body part 21, short-pulse laser light from the short-pulse laser system 11 is focused by a focusing optical system 5 via a reflective mirror 28, and is caused to irradiate the organic crystal 23 so that working is performed. The reflective mirror 28 has the function of the irradiation position control mechanism 4 in FIG. 1, and the stage 22 has the function of the stage 7 in FIG. 1. As a result of the movement of these parts, the organic crystal 23 is worked into a specified shape. The working method used is the working method described above. However, the positioning of the sample is performed not by visual inspection, but rather on the basis of an image picked up by the sample monitoring camera 27.

In cases where X-ray crystal structure analysis of the organic crystal is performed, this crystal is ordinarily transferred to a measurement jig such as that shown in FIG. 4 (a) or (b), and is mounted in an X-ray crystal structure analysis device. However, as was described above, since the growth and manipulation of organic crystals are difficult, damage that is newly generated during the transfer operation may be added to defects and damage present from the initiation of growth, so that there are cases in which the crystal that is cooled by being disposed in the X-ray crystal structure analysis device includes portions in which the crystal quality is clearly inferior. In such cases, measures involving irradiation with X-rays are often taken only in areas where the crystal quality appears to be high; however, depending on the location of the damage, it may not be possible to handle such situations. Moreover, the material adhering to the periphery of the crystal and the tool for holding the crystal become causes for lowering the measurement precision.

In principle, the most preferable method is a method in which measurements are performed after the crystal and the material adhering to the periphery of the crystal are worked in the cooled state so that only the single crystal portions of high quality are present in the X-ray transmission region. However, it has been extremely difficult to realize this in the conventional working methods.

In contrast, the working method of the present invention using a laser provides working that does not require mechanical contact or a temperature cycle between ordinary temperatures and low temperatures. Therefore, if the present invention is applied, the crystal in a cooled state that is disposed in FIG. 4 (a) or (b) can easily be worked in this location. An X-ray diffraction pattern can be detected as a result of the organic crystal 23 being irradiated with X-rays from the X-ray generating device 24 in this location before and after working. If a favorable X-ray diffraction pattern cannot be obtained due to insufficient working conditions, reworking of the organic crystal can be performed immediately in this cooled state on the spot.

Embodiment 1

In order to investigate the basic characteristics of the working method of the present invention, a single crystal of phosphoenol pyruvic acid carboxylase (PEPC), which is a protein, was irradiated with ultraviolet short-pulse laser light having a wavelength of 193 nm using an apparatus of the type shown in FIG. 1; as a result, the crystal was cut in two.

Figure 9:
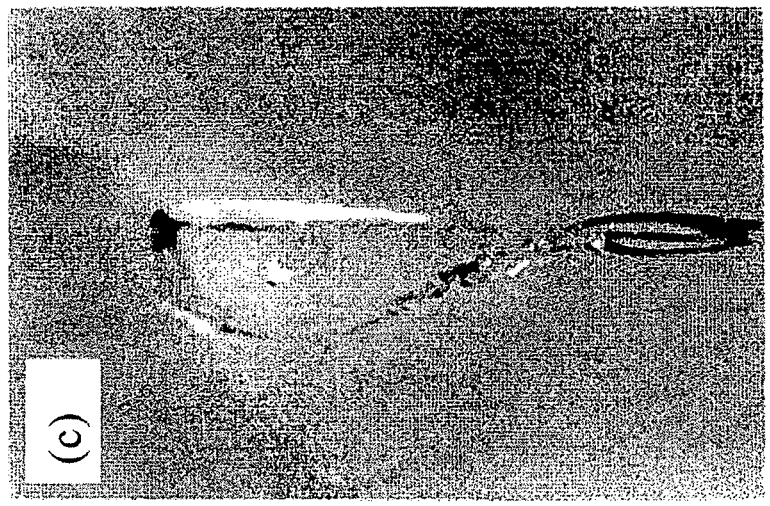
FIG. 9 is a diagram showing states before and after a section is cut across a PEPC crystal in a first embodiment of the present invention.
Figure 9:
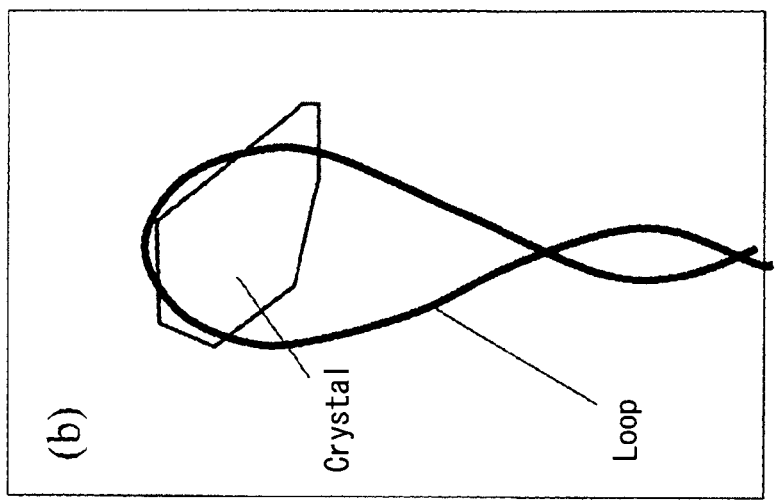
Figure 9:
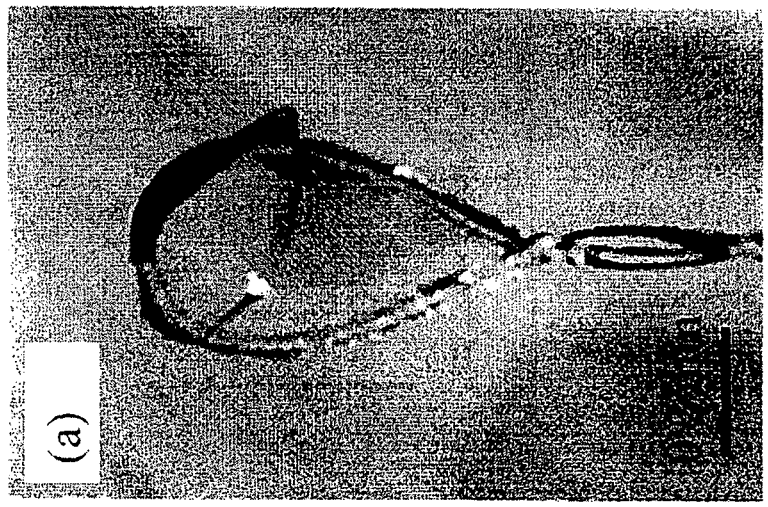

The grown PEPC crystal was scooped up with a loop as shown in FIG. 4 (a) and held by surface tension. In this state, a low-temperature gas using nitrogen was caused to jet onto the PEPC crystal, the solution supporting the crystal, and the loop so that these were cooled to a low temperature. A photograph of the crystal prior to working is shown in FIG. 9 (a), and its model diagram is shown in FIG. 9 (b).

In a state in which a low-temperature gas was continuously caused to jet, irradiation was performed with approximately one million shots of laser light having a repetition frequency of 3.4 kHz, a pulse width of approximately 1 ns, a spot diameter of 20 μm, and an energy density of 50 mJ/cm$^2$ while moving the spot at 0.5 mm/sec, and the loop made of nylon® was vertically cut in half together with the frozen PEPC crystal and solution. A photograph following this cutting is shown in FIG. 9 (c). It is seen that the PEPC crystal was cleanly cut.

It was also confirmed that a single crystal of human lysozyme, which is a protein, can be cut in a low-temperature cooled state using the same device construction and method.

Embodiment 2

A membrane protein single crystal (AcrB crystal) was irradiated with ultraviolet short-pulse laser light having a wavelength of 193 nm using an apparatus of the type shown in FIG. 1. As a result, the crystal was cut in two.

Figure 10:
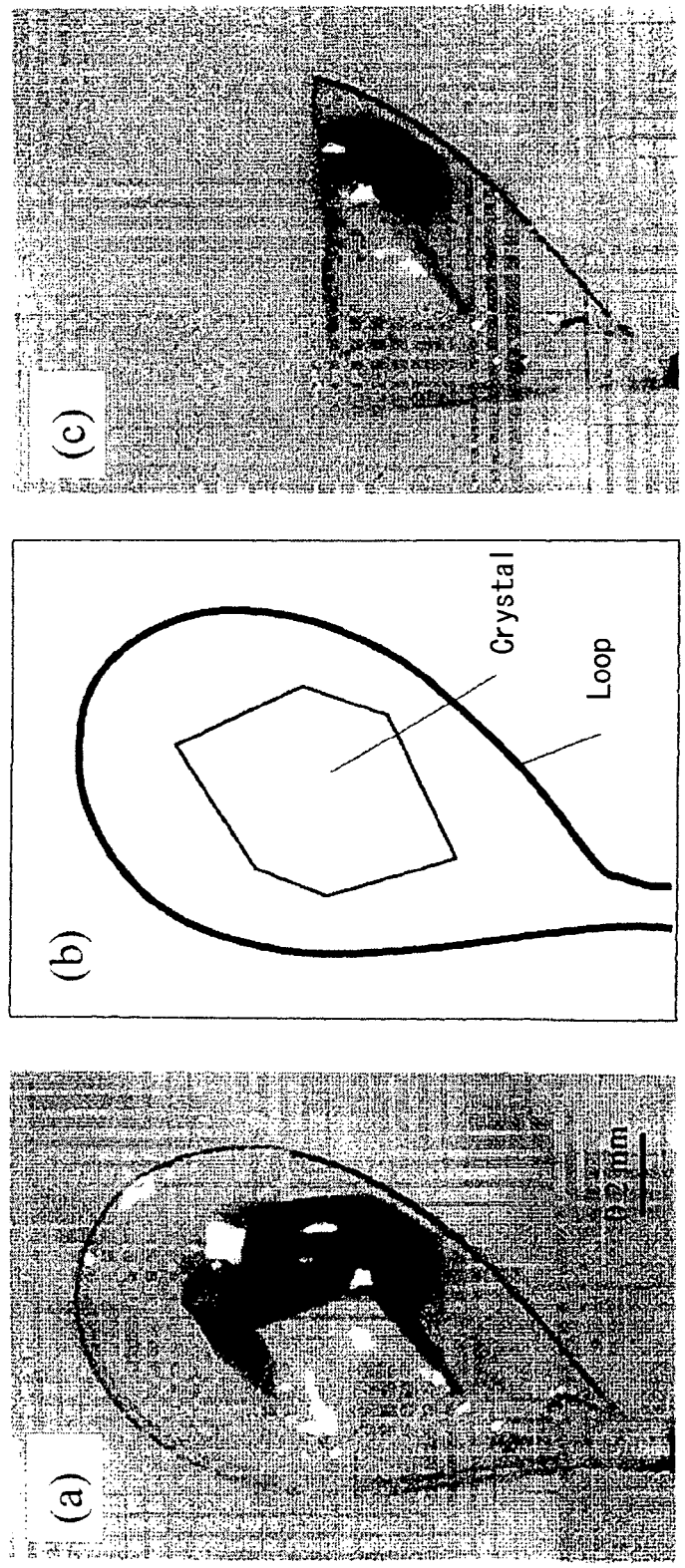
FIG. 10 is a diagram showing states before and after a section is cut across an AcrB crystal in a second embodiment of the present invention.

The grown AcrB crystal was scooped up with a loop as shown in FIG. 4 (a) and held by surface tension. In this state, a low-temperature gas using nitrogen was caused to jet onto the AcrB crystal, the solution supporting the crystal, and the loop so that these were cooled to a low temperature. A photograph of the crystal prior to working is shown in FIG. 10 (a), and its model diagram is shown in FIG. 10 (b).

In a state in which a low-temperature gas was continuously caused to jet, irradiation was performed with approximately one million shots of laser light having a repetition frequency of 3.4 kHz, a pulse width of approximately 1 ns, a spot diameter of 20 μm, and an energy density of 50 mJ/cm$^2$ while moving the spot at 0.5 mm/sec, and the loop made of nylon® was vertically cut in half together with the frozen AcrB crystal and solution. A photograph following this cutting is shown in FIG. 10 (c). It is seen that the AcrB crystal was cleanly cut. There were no variations in the values of the effective diffraction resolution and lattice constant in the AcrB crystal prior to the laser working and following the laser working.

Embodiment 3

X-ray diffraction patterns were measured before and after the working of a protein single crystal (egg white lysozyme crystal) by irradiation with ultraviolet short-pulse laser light having a wavelength of 193 nm using an apparatus of the type shown in FIG. 8, and the data obtained was compared. In the measurements of the X-ray diffraction patterns, an ultraX18 (voltage 50 kV, current 100 mA) manufactured by Rigaku Denki Co. was used as the X-ray generating device, and a RAXIS IV++ was used as the detector. In the respective measurements, the distance between the crystal and detector was set at 150 mm, the detection angle was set at 2°, the measurement time was set at 10 minutes/2°, and the range of the measurement angles was set at 20°.

Figure 11:
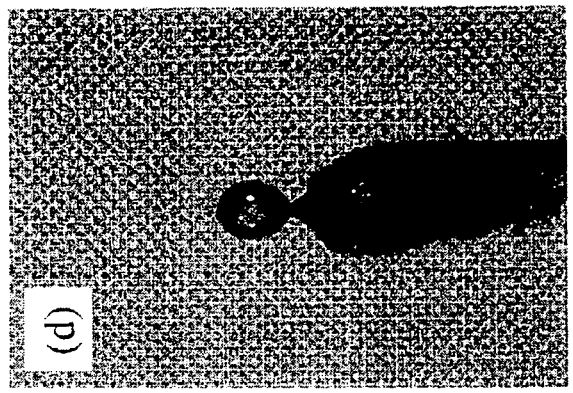
FIG. 11 is a diagram showing states before and after an egg white lysozyme crystal is worked in a third embodiment of the present invention.
Figure 11:
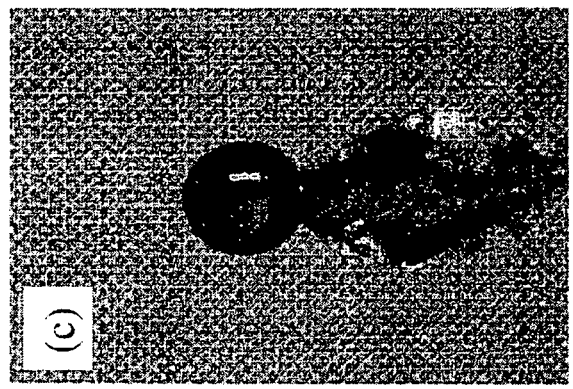
Figure 11:
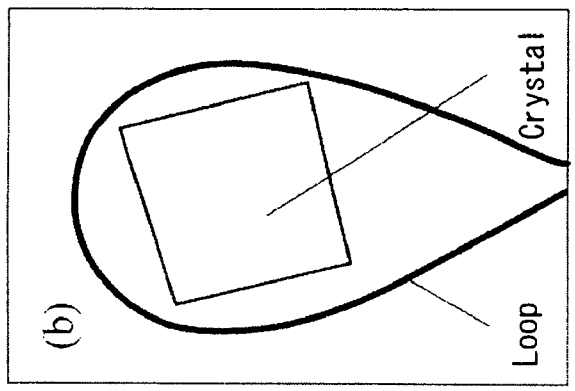
Figure 11:
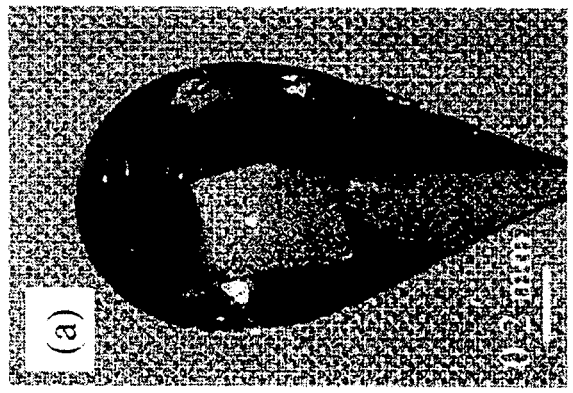

The grown egg white lysozyme crystal was scooped up with a loop as shown in FIG. 4 (a) and held by surface tension. In this state, a low-temperature gas using nitrogen was caused to jet onto the egg white lysozyme crystal, the solution supporting the crystal, and the loop so that these were cooled to a low temperature, and these were set in the X-ray crystal structure analysis device. A photograph of the crystal prior to working is shown in FIG. 11 (a), and its model diagram is shown in FIG. 11 (b).

After measuring the X-ray diffraction pattern of the unworked crystal, the crystal, the frozen solution around the crystal, and the loop were irradiated with a total of approximately five million shots of laser light pulses having a repetition frequency of 3.4 kHz, a pulse width of approximately 1 ns, a spot diameter of 20 μm, and an energy density of 50 mJ/cm$^2$ while moving the spot position in a circular manner and by rotating the rotating stage on which the crystal was set, and the crystal was worked into a spherical shape with a diameter of approximately 300 μm. A photograph of the crystal following working is shown in FIG. 11 (c). It is seen that the egg white lysozyme crystal was worked into a spherical shape without causing any damage. Such a worked shape was extremely difficult to achieve in mechanical working methods even under ordinary temperature conditions. The X-ray diffraction pattern was measured under the same conditions as those used in the measurement of the unworked crystal described above.

Furthermore, additional working was performed on this spherical crystal by irradiation with approximately one million pulses of laser light having a repetition frequency of 3.4 kHz, a pulse width of approximately 1 ns, a spot diameter of 20 μm, and an energy density of 50 mJ/cm², and the shape of the crystal was adjusted to a spherical shape with a diameter of approximately 150 μm. A photograph following working is shown in FIG. 11 (d). For the crystal following this additional working as well, the X-ray diffraction pattern was measured under the same conditions.

The series of laser working and X-ray diffraction pattern measurements described above were all performed in a state in which a low-temperature gas using nitrogen was continuously caused to jet onto the egg white lysozyme crystal.

Table 1 shows a summary of the measurement results of the X-ray diffraction pattern under the three types of condition in FIGS. 11 (a), (b) and (c). Since I/sigma depends upon the size of the crystal, the values decrease in order of (a), (b) and (c). However, for the diffraction resolution, lattice constant, mosaicity, integrity of data, and Rmerge, no major variations of values were seen. It was demonstrated from these results that there was no serious damage to the crystal as a result of laser working.

Embodiment 4

A single crystal of 4-dimethylamino-N-methyl-4-stilbazolium tosylate (DAST), which is an organic low molecule, was irradiated with ultraviolet short-pulse laser light having a wavelength of 193 nm using an apparatus of the type shown in FIG. 1. As a result, the crystal was cut in two.

A low-temperature gas was caused to jet onto the grown DAST crystal (3.0×2.8×0.5 mm), and this was cooled to a low temperature. In a state in which the low-temperature gas was continuously caused to jet, the frozen DAST crystal was cut in half by irradiation with approximately six million shots of laser light having a repetition frequency of 3.4 kHz, a pulse width of approximately 1 ns, a spot diameter of 20 μm, and an energy density of 200 mJ/cm² while moving the spot at 0.5 mm/sec. In the cut crystal, no serious damage was observed in non-irradiated portions.

Embodiment 5

Using an apparatus of the type shown in FIG. 1, ultraviolet short-pulse laser light having a wavelength of 193 nm was caused to irradiate a single crystal of one type of organic supramolecular complex (since the structure has not yet been elucidated, the name has not been determined). As a result, the crystal was cut in two.

The grown organic supramolecular complex crystal (0.1× 0.1×0.4 mm) was scooped up with a loop as shown in FIG. 4 (a) and held by surface tension. In this state, a low-temperature gas using nitrogen was caused to jet onto the crystal, the solution supporting the crystal, and the loop so that these are cooled to a low temperature.

In a state in which the low-temperature gas was continuously caused to jet, irradiation was performed with approximately one million shots of laser light having a repetition frequency of 3.4 kHz, a pulse width of approximately 1 ns, a spot diameter of 20 μm, and an energy density of 50 mJ/cm² while moving the spot at 0.5 mm/sec, and the loop made of nylon® was vertically cut in half together with the frozen crystal and solution. In the cut crystal, no serious damage was observed in non-irradiated portions.

TABLE 1

Measurement results of X-ray diffraction pattern of chicken egg white lysozyme crystal before and after working

|  | (a) | (b) | (c) |
|---|---|---|---|
| Diffraction resolution (Å) | 1.9 | 1.9 | 1.9 |
| Lattice constant (Å) | a = 77.39 | a = 77.39 | a = 77.41 |
|  | c = 37.50 | c = 37.50 | c = 37.53 |
| Mosaicity | 0.356 | 0.313 | 0.271 |
| Integrity of data (%) | 68.4 | 69.4 | 70.3 |
| Rmerge (%) | 4.2 | 3.1 | 3.3 |
| I/sigma | 30.1 | 27.6 | 20.1 |

The invention claimed is:

1. An organic crystal observing and working method in which an organic crystal is observed by irradiation with light other than ultraviolet light and is worked by irradiation with ultraviolet short-pulse laser light, wherein both observation and working are performed while maintaining a low-temperature state in which a portion of the organic crystal being worked is cooled to a low temperature.

2. An organic crystal observing and working method in which an organic crystal is observed by irradiation with light other than ultraviolet light and is worked by irradiation with ultraviolet short-pulse laser light, wherein both observation and working are performed while maintaining a low-temperature state in which portions of the organic crystal and a substance holding the organic crystal that are being worked are cooled to a low temperature.

3. The organic crystal working method according to claim 1 or 2, wherein the low temperature is 0° C. or below.

4. The organic crystal working method according to claim 1 or 2, wherein the portion of the organic crystal that is being worked or the portions of the organic crystal and the substance holding the organic crystal that are being worked are maintained in the low-temperature state by a method in which a low-temperature gas is caused to jet directly or indirectly onto an area that includes the portion or portions where the low-temperature state is to be maintained.

5. The organic crystal working method according to claim 3, wherein the low-temperature gas is either a nitrogen gas or helium gas.

6. The organic crystal working method according to claim 1 or 2, wherein the organic crystal is at least one crystal selected from a set consisting of organic low molecules, organic supramolecular complexes, resins, proteins, sugars, lipids and nucleic acids.

7. The organic crystal working method according to claim 1 or 2, wherein the working is performed from a surface of the organic crystal or surfaces of the organic crystal and the substance holding the organic crystal.

8. The organic crystal working method according to claim 1 or 2, wherein a wavelength of the short-pulse laser light is shorter than an absorption end on a short-wavelength side of the organic crystal.

9. The organic crystal working method according to claim 1 or 2, wherein a wavelength of the short-pulse laser light is 400 nm or less.

10. The organic crystal working method according to claim 1 or 2, wherein a pulse width of the short-pulse laser light is 100 ns or less.

11. The organic crystal working method according to claim 1 or 2, wherein an energy density per pulse of the short-pulse laser light is 1 mJ/cm² or greater.

12. An organic crystal working apparatus for working organic crystals, the organic crystal working apparatus comprising:

a short-pulse laser, an optical system which conducts ultraviolet short-pulse laser light emitted from the short-pulse laser to an organic crystal constituting an object of working, and which irradiates a location of the organic crystal that is being worked, a mechanism that varies relative positions of the optical system and the organic crystal, and means for cooling the object of working to a low temperature, wherein the apparatus is configured such that the organic crystal is observed by irradiation with light other than ultraviolet light and worked by irradiation with the ultraviolet short-pulse laser light, while the organic crystal is cooled to the low temperature.

13. The organic crystal working apparatus according to claim 12, wherein the means for cooling the object of working to the low temperature comprises means for causing a low-temperature gas to jet onto the organic crystal or a container holding the organic crystal at a position where the organic crystal is being worked.

14. The organic crystal working apparatus according to claim 12, wherein the means for cooling the object of working to the low temperature comprises a cooling container that accommodates the organic crystal or a container holding the organic crystal at a position where the organic crystal is being worked.

15. The organic crystal working apparatus according to claim 12, wherein the organic crystal working apparatus includes an observation device or measuring device for observing or measuring the location where the short-pulse laser light is irradiated, simultaneously with the organic crystal.

16. The organic crystal working apparatus according to claim 15, wherein the observation device or measuring device is an optical observation device or optical measuring device using visible light, the observation device or measuring device is in a mechanically fixed relationship with the optical system, a reference point of the observation device or measuring device coincides with the location where the short-pulse laser light is irradiated, and the apparatus has a function of indirectly observing or measuring the short-pulse laser light irradiation location by observing or measuring a position of the reference point of the observation device or measuring device.

17. An organic crystal observation device, comprising the organic crystal working apparatus according to claim 12.

18. The organic crystal observation device according to claim 17, wherein the observation device is an X-ray crystal structure analysis device.

* * * * *